(12) United States Patent
Kato et al.

(10) Patent No.: US 9,401,490 B2
(45) Date of Patent: Jul. 26, 2016

(54) TRANSPARENT CONDUCTIVE FILM, ELECTRONIC DEVICE, AND METHOD FOR MANUFACTURING ELECTRONIC DEVICE

(75) Inventors: Kunihisa Kato, Tokyo (JP); Tsuyoshi Muto, Tokyo (JP); Kazue Uemura, Tokyo (JP); Emi Nakajima, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 188 days.

(21) Appl. No.: 13/881,952

(22) PCT Filed: Jul. 20, 2011

(86) PCT No.: PCT/JP2011/066495
§ 371 (c)(1),
(2), (4) Date: Jul. 15, 2013

(87) PCT Pub. No.: WO2012/056774
PCT Pub. Date: May 3, 2012

(65) Prior Publication Data
US 2013/0284244 A1 Oct. 31, 2013

(30) Foreign Application Priority Data
Oct. 29, 2010 (JP) ................. 2010-244348

(51) Int. Cl.
*H01L 31/00* (2006.01)
*H01L 51/44* (2006.01)
(Continued)

(52) U.S. Cl.
CPC ............. *H01L 51/442* (2013.01); *C08J 7/045* (2013.01); *C08J 7/047* (2013.01); *C09J 7/021* (2013.01);
(Continued)

(58) Field of Classification Search
CPC combination set(s) only.
See application file for complete search history.

(56) References Cited

U.S. PATENT DOCUMENTS 4,089,997 A * 5/1978 Van Paesschen ..... B29C 55/026
427/171
4,166,744 A * 9/1979 Smith .................. A61K 6/0038
106/35

(Continued)

FOREIGN PATENT DOCUMENTS

CN 101283455 A 10/2008
EP 1 010 733 A2 6/2000
(Continued)

OTHER PUBLICATIONS

Author Unknown, poly(vinyl alcohol) information and properties, PolymerProcessing.com, accessed on Feb. 26, 2015 and archived to Apr. 29, 2003.*
(Continued)

*Primary Examiner* — Eli Mekhlin
(74) *Attorney, Agent, or Firm* — Oblon, McClelland, Maier & Neustadt, L.L.P.

(57) ABSTRACT

The present invention provides a transparent conductive film which is low in terms of surface resistivity and high in terms of transparency.

The transparent conductive film according to the present invention includes an adhesive conductive layer in openings of a conductive metal mesh layer provided on at least one surface of a transparent base material, wherein the conductive layer is composed of a conductive adhesive composition containing (A) a water-soluble vinyl polymer, (B) an organic additive, and (C) a conductive organic polymer compound, the organic additive (B) is at least one member selected among water-soluble polyhydric alcohols, water-soluble pyrrolidones, and hydrophilic aprotic solvents, and the conductive organic polymer compound (C) is at least one member selected among polyanilines, polypyrroles, polythiophenes, and derivatives thereof.

In addition, the present invention provides an electronic device having the foregoing transparent conductive film and a method for manufacturing an electronic device including forming a photoelectric conversion layer on an anodic layer and sticking the conductive layer of the transparent conductive film and a surface of the photoelectric conversion layer to each other at a temperature at which the foregoing conductive adhesive composition is softened or higher.

18 Claims, 2 Drawing Sheets

(51) Int. Cl.
    *H05K 1/02* (2006.01)
    *C08J 7/04* (2006.01)
    *C09J 7/02* (2006.01)
    *C09J 9/02* (2006.01)
    *C09J 11/08* (2006.01)

(52) U.S. Cl.
    CPC .. *C09J 9/02* (2013.01); *C09J 11/08* (2013.01); *H05K 1/0274* (2013.01); *C08J 2323/06* (2013.01); *C09J 2201/602* (2013.01); *C09J 2203/322* (2013.01); *C09J 2429/00* (2013.01); *C09J 2433/00* (2013.01); *C09J 2479/02* (2013.01); *Y10T 156/10* (2015.01)

(56) References Cited

U.S. PATENT DOCUMENTS

| | | | |
|---|---|---|---|
| 6,291,763 | B1 * | 9/2001 | Nakamura ............... 136/256 |
| 6,468,698 | B1 * | 10/2002 | Hamano et al. ............. 429/316 |
| 6,537,705 | B1 * | 3/2003 | Hamano et al. ............. 429/303 |
| 2005/0034755 | A1 * | 2/2005 | Okada et al. ............... 136/256 |
| 2007/0095389 | A1 * | 5/2007 | Cho et al. ................ 136/263 |
| 2007/0142516 | A1 * | 6/2007 | Wei ...................... 524/261 |
| 2009/0286097 | A1 | 11/2009 | Yang et al. |
| 2010/0178417 | A1 * | 7/2010 | Connor et al. .............. 427/74 |
| 2010/0255323 | A1 * | 10/2010 | Nakamura et al. ........... 428/457 |

FOREIGN PATENT DOCUMENTS

| | | |
|---|---|---|
| JP | 2006 352073 | 12/2006 |
| JP | 2007 305351 | 11/2007 |
| JP | 2008-149681 | 7/2008 |
| JP | 2008 288102 | 11/2008 |
| JP | 2009 500832 | 1/2009 |
| JP | 2009 140788 | 6/2009 |
| JP | 2009 146678 | 7/2009 |
| JP | 2009 259479 | 11/2009 |
| WO | WO 2007/05617 A2 | 1/2007 |
| WO | WO 2010/082428 A1 | 7/2010 |

OTHER PUBLICATIONS

Author Unknown, Occupational Safety and Health Guideline for Ethylene Glycol, U.S. Department of Health and Human Services, published in 1995.*
U.S. Appl. No. 13/978,262, filed Aug. 23, 2013, Muto, et al.
International Search Report Issued Aug. 23, 2011 in PCT/JP11/66495 Filed Jul. 20, 2011.
Extended European Search Report issued Apr. 10, 2014 in Patent Application No. 11835915.7.
Chinese Office Action issued Feb. 3, 2015, in China Patent Application No. 201180049913.7.
Office Action issued Jan. 13, 2015 in Japanese Patent Application No. 2012-540711.

\* cited by examiner

TRANSPARENT CONDUCTIVE FILM, ELECTRONIC DEVICE, AND METHOD FOR MANUFACTURING ELECTRONIC DEVICE

TECHNICAL FIELD

The present invention relates to a transparent conductive film, an electronic device, and a method for manufacturing an electronic device. In more detail, the present invention relates to a transparent conductive film capable of manufacturing an electronic device by a lamination process because it is excellent in terms of a balance between transparency and low resistivity, and itself has excellent adhesiveness, and to an electronic device using the same and a method for manufacturing an electronic device by a lamination process.

BACKGROUND ART

In recent years, in organic electroluminescences, various solar cells, touch panels, mobile phones, electronic papers, and the like, transparent electrodes using a transparent conductive film are being eagerly investigated.

For example, organic photoelectric conversion or electric-optical conversion devices typified by electronic solar cells are usually fabricated by laminating materials on electrodes composed of a transparent conductive film. As for the transparent conductive film, though various conductive films such as metal thin films, metal oxide thin films, conductive nitride thin films, etc. are being investigated, metal oxide thin films are the mainstream at present because they are chiefly capable of making both light transmission properties and conductivity compatible with each other and are also excellent in terms of durability.

Above all, in particular, tin-doped indium oxide (ITO) is well balanced between light transmission properties and conductivity, and it is widely used (see Patent Document 1, etc.). However, following an increase of the area of a transparent electrode, a more reduction of the resistance is required, and ITO is still not sufficient yet in terms of conductivity.

On the other hand, there is proposed a sheet in which a metal-made fine mesh or grid is formed on a transparent base material such as PET, etc. (see Patent Document 2, etc.). There is a possibility of utilization of such a sheet as a transparent electrode because its translucency and conductivity can be controlled according to a design of the mesh (rate of opening determined by a pitch or line width). For example, there is disclosed a transparent conductive film having a conductive metal mesh layer and a transparent conductive layer composed of a conductive polymer compound such as polythiophene on at least one surface of a transparent base material sheet (see Patent Document 3, etc.).

Now, in the case of laminating layers composed of an organic element material, electronic devices have hitherto been manufactured by a vacuum vapor deposition method or a dry process analogous thereto, a wet process typified by coating, or a lamination process via a pressure-sensitive adhesive or adhesive layer (see Patent Document 4, etc.).

In such the lamination process, transparent electrode films and transparent conductive films having adhesiveness are desired; however, the conventional transparent conductive films involve a problem on a balance among transparency, adhesiveness, and low surface resistivity.

Then, it has been proposed to use, as a conductive component in a conductive adhesive composition, a conductive organic polymer compound such as polythiophene or derivatives thereof. More specifically, it has been proposed to manufacture an electronic device by a lamination process via a pressure-sensitive adhesive or adhesive layer containing a conductive organic polymer compound (see Patent Document 5, etc.).

However, in the lamination process through a pressure-sensitive adhesive layer containing a conductive organic polymer compound, the utilization was limited in an element application in which cleanliness and uniformity of an interface are important. In addition, there was involved such a problem that the performance of an electronic device is lowered, for example, the conductivity of the pressure-sensitive adhesive or adhesive layer is low, the carrier injection efficiency at the laminate interface is lowered, an adhesive force at the interface is low, and the like.

PRIOR ART DOCUMENTS

Patent Documents
Patent Document 1: JP-A-2007-305351
Patent Document 2: JP-A-2008-288102
Patent Document 3: JP-A-2009-146678
Patent Document 4: JP-A-2006-352073
Patent Document 5: JP-T-2009-500832

DISCLOSURE OF THE INVENTION

Problem to be Solved by the Invention

Under such circumstances, the present invention has been made. An object of the present invention is to provide a transparent conductive film, an electronic device, and a method for manufacturing an electronic device, each of which is capable of solving the foregoing problem.

Means for Solving the Problem

In order to solve the foregoing problem, the present inventors made extensive and intensive investigations. As a result, it has been found that the foregoing problem can be solved by combining a conductive layer composed of a specified conductive adhesive composition with a conductive metal mesh layer, thereby leading to accomplishment of the present invention.

Specifically, the present invention provides:
(1) A transparent conductive film comprising an adhesive conductive layer in openings of a conductive metal mesh layer provided on at least one surface of a transparent base material, wherein
the conductive layer comprises a conductive adhesive composition containing (A) a water-soluble vinyl polymer, (B) an organic additive, and (C) a conductive organic polymer compound,
the organic additive (B) is at least one member selected among water-soluble polyhydric alcohols, water-soluble pyrrolidones, and hydrophilic aprotic solvents, and
the conductive organic polymer compound (C) is at least one member selected among polyanilines, polypyrroles, polythiophenes, and derivatives thereof;
(2) The transparent conductive film as set forth above in (1), wherein when a glass transition temperature of the water-soluble vinyl polymer (A) is defined as T1, a melting point of the organic additive (B) is defined as T2, and a boiling point of the organic additive at 0.101 MPa (760 mmHg) is defined as T3, a relation of $T2<T1<T3$ is satisfied;
(3) The transparent conductive film as set forth above in (1), wherein the water-soluble vinyl polymer (A) is a polyvinyl alcohol, a polyvinylpyrrolidone, or an acrylic acid polymer;

(4) An electronic device comprising the transparent conductive film as set forth above in (1);

(5) The electronic device as set forth above in (4), comprising the transparent conductive film as set forth above in (1), a photoelectric conversion layer, and a cathodic layer arranged in this order; and (6) A method for manufacturing the electronic device as set forth above in (4), comprising forming a photoelectric conversion layer on a cathodic layer and sticking the conductive layer of the transparent conductive film and a surface of the photoelectric conversion layer to each other at a temperature at which the conductive adhesive composition is softened or higher.

Effects of the Invention

The transparent conductive film of the present invention is high in transparency and low in surface resistivity, and therefore, it is excellent in a balance between transparency and conductivity. Also, the transparent conductive film itself of the present invention has excellent adhesiveness, and therefore, it is able to manufacture an electronic device by a lamination process.

BEST MODES FOR CARRYING OUT THE INVENTION

The present invention is hereunder described in detail.
<Transparent Conductive Film>

The transparent conductive film of the present invention is a transparent conductive film comprising an conductive layer in openings of a conductive metal mesh layer provided on at least one surface of a transparent base material, wherein the foregoing conductive layer is composed of a specified conductive adhesive composition.

Figure 1:
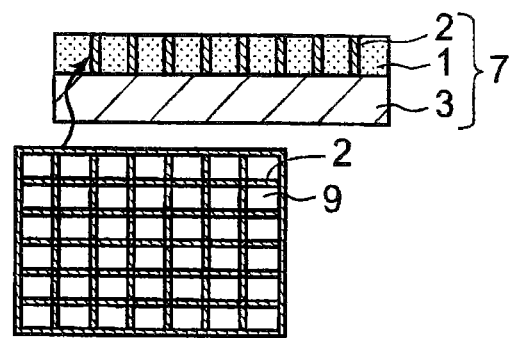
FIG. 1 is a schematic view showing a cross section of a transparent conductive film of the present invention.

Construction materials in the transparent conductive film of the present invention are described with reference to FIG. 1. In FIG. 1, "1" stands for a conductive layer, "2" stands for a conductive metal mesh layer, stands for a transparent base material, "7" stands for a transparent conductive film, and "9" stands for an opening in a conductive metal mesh layer.

The transparent conductive film of the present invention is formed in such a manner that the conductive metal mesh layer "2" is provided on at least one surface of the transparent base material "3", and the conductive layer "1" is filled in the openings of the foregoing conductive metal mesh layer "2".

[Transparent Base Material]

From the viewpoint of transparency, the transparent base material is preferably a material having a total light transmittance of 70% or more. In general, from the viewpoint of flexibility, such the transparent base material is preferably a plastic film.

As for the kind of the plastic film, examples thereof include plastic films made of polyethylene terephthalate, polyethylene naphthalate, tetraacetyl cellulose, syndiotactic polystyrene, polyphenylene sulfide, a polycarbonate, a polyarylate, polysulfone, polyestersulfone, polyetherimide, a cyclic polyolefin, or the like. Above all, those which are excellent in mechanical strength, durability, and the like are preferable.

Form the viewpoint of a balance among mechanical strength, durability, and transparency, a thickness of the transparent, base material is preferably from 3 μm to 5 mm, more preferably from 5 μm to 1 mm, and especially preferably from 10 μm to 300 μm.

[Conductive Metal Mesh Layer]

In the transparent conductive film of the present invention, the conductive metal mesh layer "2" is provided on at least one surface of the transparent base material "3".

As for the conductive metal mesh layer "2", there is exemplified a layer of a fine mesh structure by a metal grid pattern such as an electromagnetic shielding film of plasma display.

A thickness of the conductive metal mesh layer 2 is preferably from 20 nm to 100 μm, and especially preferably from 30 to 200 nm.

By adjusting the thickness to 20 nm or more, the conductivity is enhanced, and by adjusting the thickness to 100 μm or less, the whole thickness in the transparent conductive film can be made thin, so that the desired total light transmittance can be kept.

The conductive metal mesh layer "2" has a fine mesh structure by a metal grid pattern, and therefore, it has the openings "9" as shown in FIG. 1.

From the viewpoint of transparency, a rate of opening in the openings "9" is preferably 80% or more, more preferably 90% or more, and still more preferably 95% or more.

A pitch of the openings is preferably from 1 to 3,000 μm, and more preferably from 1 to 1,500 μm. When the pitch of the openings is 1 μm or less, there may be the case where the transparency is lowered, whereas when it is 3,000 μm or more, an effect for enhancing the conductivity is hardly obtainable. A line width of the conductive metal mesh layer "2" is preferably from 100 nm to 1,000 μm, and more preferably from 1 to 100 μm. When the line width exceeds 1,000 μm, there may be the case where the transparency is lowered, whereas when it is less than 100 nm, there may be a possibility that an effect for enhancing the conductivity is hardly obtainable.

Examples of a material for forming the conductive metal mesh layer "2" include metals and alloys. Examples thereof include metals themselves such as gold, silver, copper, aluminum, titanium, chromium, iron, cobalt, nickel, zinc, tin, iridium, indium, tungsten, molybdenum, platinum, iridium, hafnium, niobium, tantalum, tungsten, magnesium, etc.; alloys composed mainly of at least one member of the group consisting of these metals; and the like. Of these, from the viewpoints of low corrosiveness and high conductivity, metals including gold, silver, copper, and platinum are preferable.

As for the alloy, it is possible to properly select stainless steel, nickel-chromium, Inconel (a trade name), bronze, phosphor bronze, brass, duralumin, cupronickel, Invar, Monel, a metallic phosphorus compound such as a nickel-phosphor alloy, etc., a metallic boron compound such as nickel boron, etc., a nitride such as titanium nitride, etc. Especially, copper and an alloy composed mainly of copper, nickel and an alloy composed mainly of nickel, cobalt and an alloy composed mainly of cobalt, chromium and an alloy composed mainly of chromium, and aluminum and an alloy composed mainly of aluminum are preferably used because they are excellent in conductivity and good in processability.

The conductive metal mesh layer "2" may be a single layer composed of a metal or an alloy, or may be of a multilayer structure in which layers composed of at least two or more kinds of metals or alloys are laminated.

A method for providing the foregoing conductive metal mesh layer "2" is described.

Examples of a method for providing the foregoing conductive metal mesh layer "2" on the transparent base material "3" include a dry process such as PVD (physical vapor deposition), e.g., vacuum vapor deposition, sputtering, ion plating, etc., CVD (chemical vapor deposition), e.g., thermal CVD, atomic layer deposition (ALD), etc.; a wet process such as coating of every sort, e.g., dip coating, spin coating, spray coating, gravure coating, die coating, doctor blade coating, and electrochemical deposition; a photolithography method; a silver salt method; an inkjet method; and a screen printing method. The method is properly selected according to the material of the conductive metal mesh layer "2".

In the present invention, in order to enhance the adhesion between the conductive metal mesh layer "2" and the transparent base material "3", a conventionally known easy-adhesive layer may be formed between the conductive metal mesh layer "2" and the transparent base material "3".

In addition, for the purpose of enhancing the conductivity of the transparent conductive film, a transparent conductive layer may be provided between the conductive metal mesh layer "2" and the transparent base material "3".

As for such a transparent conductive layer, a conductive metal oxide and the like can be used.

Examples of the conductive metal oxide include tin-doped indium oxide (ITO), iridium oxide ($IrO_2$), indium oxide ($In_2O_3$), tin oxide ($SnO_2$), fluorine-doped tin oxide (FTO), indium oxide-zinc oxide (IZO), zinc oxide (ZnO), gallium-doped zinc oxide (GZO), aluminum-doped zinc oxide (AZO), molybdenum oxide ($MoO_3$), titanium oxide ($TiO_2$), and the like. These conductive metal oxides can be formed by a known method including a dry process such as PVD (physical vapor deposition), e.g., vacuum vapor deposition, sputtering, ion plating, etc., CVD (chemical vapor deposition), e.g., thermal CVD, atomic layer deposition (ALD), etc. In view of transparency and conductivity, a thickness of such the transparent conductive layer is usually from 10 to 1,000 nm, preferably from 10 to 500 nm, and especially preferably from 30 to 300 nm.

[Conductive Layer]

The transparent conductive film of the present invention has the conductive layer "1" in the openings "9" of the conductive metal mesh layer "2" provided on at least one surface of the transparent base material "3".

[1] Conductive Adhesive Composition:

The conductive layer "1" is composed of a conductive adhesive composition.

The conductive adhesive composition contains (A) a water-soluble vinyl polymer, (B) an organic additive, and (C) a conductive organic polymer compound, wherein the organic additive (B) is at least one member selected among water-soluble polyhydric alcohols, water-soluble pyrrolidones, and hydrophilic aprotic solvents, and the conductive organic polymer compound (C) is at least one member selected among polyanilines, polypyrroles, polythiophenes, and derivatives thereof.

First of all, each of the components in the conductive adhesive composition is described.

<Component (A)>

The water-soluble vinyl polymer as the component (A) is a compound for imparting adhesiveness to a conductive layer composed of the conductive adhesive composition. The water-soluble vinyl polymer also includes a warm water-soluble vinyl polymer.

In view of film formation properties, adhesiveness, and handling, a glass transition temperature (Tg) of the water-soluble polyvinyl polymer is preferably in the range of from −50 to 150° C., more preferably in the range of from 20 to 140° C., still more preferably in the range of from 30 to 130° C., and yet still more preferably in the range of from 40 to 120° C.

The water-soluble polyvinyl polymer is a compound having a structural unit of —$CH_2$—CH(R)— in the polymer. There are no particular limitations so far as the polymer contains at least 30% by mole or more of this structural unit. The water-soluble polyvinyl polymer may be a homopolymer or a copolymer each containing this structural unit. Of these, compounds in which R is any one of a hydroxyl group, a carboxyl group, a pyrrolidone group, or an acrylamide group are preferable.

A compound in which R is a hydroxyl group is one having a structural unit of —$CH_2$—CH(OH)—, and specific examples of the hydroxyl group-containing water-soluble vinyl polymer include a polyvinyl alcohol (PVA), a polyvinyl alcohol-ethylene copolymer, a polyvinyl alcohol-(N-vinyl-formaldehyde) copolymer, a polyvinyl alcohol-vinyl acetate copolymer, and the like.

The hydroxyl group-containing water-soluble polyvinyl polymer may be a partially saponified product or a completely saponified product. A degree of saponification is preferably from 20 to 100% by mole, more preferably from 35 to 100% by mole, and still more preferably from 40 to 100% by mole. In the case where the degree of saponification is less than 20% by mole, the solubility is lowered.

A compound having a carboxyl group in the polymer is one having a structural unit of —$CH_2$—CH(COOH)—. Specific examples of the carboxyl group-containing water-soluble polyvinyl polymer include a polyacrylic acid (PAA) and the like.

A water-soluble vinyl polymer in which R is a pyrrolidone group is one having a structural unit of —$CH_2$—CH($NO_4$)—, and specific examples thereof include a polyvinylpyrrolidone (PVP), an N-vinyl-2-pyrrolidone-ethylene copolymer, an N-vinyl-2-pyrrolidone-vinyl acetate copolymer, and the like.

A water-soluble vinyl polymer in which R is an acrylamide group is one having a structural unit of —$CH_2$—CH($CONH_2$)—, and specific examples thereof include a polyacrylamide and the like.

For the purpose of imparting various functions, the water-soluble vinyl polymer may contain, in addition to the foregoing structural unit, a functional group such as a hydrophobic group, a cationic group, an anionic group including a sulfonic acid group, a thiol group, a carbonyl group, a silanol group, etc.

Among these water-soluble polyvinyl polymers, in view of film formation properties, adhesiveness, and handling and also in view of the fact that the manufacture of an electronic device as described later can be easily achieved, those in which R is any one of a hydroxyl group, a pyrrolidone group, or a carboxyl group are preferable, and PVA, PVP, and PAA are preferable. Of these, in view of conductivity of the obtained conductive layer and adhesiveness, PAA in which R is a carboxyl group is more preferable.

A weight average molecular weight (Mw) of the water-soluble polyvinyl polymer is usually from 500 to 500,000, preferably from 500 to 300,000, more preferably from 1,000 to 200,000, and still more preferably from 3,000 to 150,000.

When the weight average molecular weight Mw of the water-soluble vinyl polymer falls within this range, in the transparent conductive film and the electronic device of the present invention, sufficient film formation properties and adhesiveness are revealed.

Incidentally, the foregoing weight average molecular weight Mw is a numerical value converted into a standard polystyrene, which is measured by means of gel permeation chromatography (GPC).

So far as the foregoing water-soluble polyvinyl polymer is a polymer containing 30% by mole or more of the foregoing structural unit, it may also be copolymerized with one or two or more kinds of other copolymerizable ethylenically unsaturated monomers.

Examples of the other copolymerizable ethylenically unsaturated monomer include carboxylic acid vinyl ester monomers such as vinyl formate, vinyl acetate, vinyl propionate, isopropenyl acetate, vinyl valerate, vinyl caprate, vinyl caprate, vinyl laurate, vinyl stearate, vinyl benzoate, vinyl versatate, vinyl pivalate, etc.; olefins such as ethylene, propylene, butylene, etc.; aromatic vinyl monomers such as styrene, α-methylstyrene, etc.; ethylenically unsaturated carboxylic acid monomers such as methacrylic acid, fumaric acid, maleic acid, itaconic acid, monoethyl fumarate, maleic anhydride, itaconic anhydride, etc.; ethylenically unsaturated carboxylic acid alkyl ester monomers such as methyl (meth) acrylate, ethyl (meth)acrylate, n-butyl (meth)acrylate, 2-ethylhexyl (meth)acrylate, dimethyl fumarate, dimethyl maleate, diethyl maleate, diisopropyl itaconate, etc.; vinyl ether monomers such as methyl vinyl ether, n-propyl vinyl ether, isobutyl vinyl ether, dodecyl vinyl ether, etc.; ethylenically unsaturated nitrile monomers such as (meth)acrylonitrile, etc.; halogenated vinyl monomers or vinylidene monomers such as vinyl chloride, vinylidene chloride, vinyl fluoride, vinylidene fluoride, etc.; allyl compounds such as allyl acetate, allyl chloride, etc.; sulfonic acid group-containing monomers such as ethylene sulfonic acid, (meth)allyl sulfonic acid, 2-acrylamido-2-methylpropane sulfonic acid, etc.; quaternary ammonium group-containing monomers such as 3-(meth)acrylamidopropyl trimethylammonium chloride, etc.; vinyltrimethoxysilane, N-vinylformamide, methacrylamide, and the like. One or two or more kinds of these monomers can be used.

<Component (B)>

Hereinafter, the organic additive as the compound (B) is described.

The present invention is characterized in that the organic additive as the component (B) is at least one member selected among water-soluble polyhydric alcohols, water-soluble pyrrolidones, and hydrophilic aprotic solvents.

For the purpose of enhancing the conductivity, the organic additive as the component (B) is added. While details are not elucidated yet, the conductivity is enhanced because by adding such an organic additive, the orientation properties of a conductive organic polymer compound as the component (C) as described later are enhanced.

The organic additive as the component (B) is preferably one having a boiling point of 100° C. or higher at 1.101 MPa (760 mmHg). When the boiling point of which is lower than 100° C., those are not preferable because in a mixing process or during storage of the conductive adhesive composition, or various heating processes at the time of manufacturing an electronic device as described later, the organic additive undergoes volatilization and scattering, and its blending ratio is lowered, so that the effect for enhancing the conductivity is lowered.

The boiling point is more preferably in the range of from 120 to 300° C., and still more preferably in the range of from 140 to 300° C.

Specific examples of the water-soluble polyhydric alcohol as one of the organic additives as the component (B) include glycerin, diglycerin, polyglycerin, ethylene glycol, diethylene glycol, propylene glycol, dipropylene glycol, 1,3-butanediol, 1,4-butanediol, erythritol, sorbitol, sorbitan, glucose, maltitol, polyethylene glycol, 1,2-butylene glycol, 1,3-butylene glycol, 2,3-butylene glycol, 3-methyl-1,3-butylene glycol, tetramethylene glycol, 1,2-pentanediol, 1,2-hexanediol, trimethylolpropane, pentaerythritol, methyl glucoside, polypropylene glycol, xylitol, trehalose, maltitol, mannitol, and alkylene oxide derivatives thereof, and the like. One or two or more kinds of these water-soluble polyhydric alcohols may be used.

Examples of the water-soluble pyrrolidone as one of the organic additives as the component (B) include N-methylpyrrolidone, N-ethylpyrrolidone, N-propylpyrrolidone, N-isopropylpyrrolidone, N-butylpyrrolidone, N-t-butylpyrrolidone, N-pentylpyrrolidone, N-hexylpyrrolidone, N-heptylpyrrolidone, N-cyclohexylpyrrolidone, N-octylpyrrolidone, N-(2-ethylhexyl)pyrrolidone, N-phenylpyrrolidone, N-benzylpyrrolidone, phenethylpyrroplidone, 2-methoxyethylpyrrolidone, 2-methoxypropylpyrrolidone, 2-hydroxypropylpyrrolidone, vinylpyrrolidone, 2-pyrrolidone, and the like. One or two or more kinds of these may be used.

In the present invention, an aprotic solvent is added as one of the organic additives as the component (B). In the present invention, the aprotic solvent is one to be blended in the conductive adhesive composition without undergoing volatilization and scattering. Examples of such the hydrophilic aprotic solvent as one of the organic additives as the component (B) include dimethyl sulfoxide and N,N-dimethylformamide.

In the present invention, it is preferable to select the component (B) through a combination with the component (A) so as to satisfy the following relation.

That is, when a glass transition temperature (Tg) of the water-soluble polyvinyl polymer as the component (A) is defined as T1, a melting point of the organic additive as the component (B) is defined as T2, and a boiling point of the organic additive at 0.101 MPa (760 mmHg) is defined as T3, the combination is a combination satisfying a relation of T2<T1<T3.

Herein, the glass transition temperature T1 of the water-soluble vinyl polymer as the component (A) is a value measured with a differential scanning calorimeter (DSC).

Specific examples of the water-soluble polyhydric alcohol which satisfies the relation of T2<T1<T3 relative to the component (A) include glycerin [melting point T2: 18° C., boiling point T3: 290° C.], ethylene glycol [melting point T2: −11.5° C., boiling point T3: 197° C.], diethylene glycol [melting point T2: −6.5° C., boiling point T3: 245° C.], propylene glycol [melting point T2: −59° C., boiling point T3: 188.2° C.], dipropylene glycol [melting point T2: −40° C., boiling point T3: 232° C.], 1,3-butanediol [melting point T2: −50° C., boiling point T3: 207.5° C.], 1,4-butanediol [melting point T2: 19° C., boiling point T3: 235° C.], and the like. Above all, from the viewpoint of an enhancement in the conductivity, glycerin and 1,4-butanediol are preferable.

Examples of such a water-soluble pyrrolidone derivative as the component (B) which satisfies the relation of T2<T1<T3 include N-methylpyrrolidone [melting point T2: −24° C., boiling point T3: 202° C.], vinylpyrrolidone [melting point T2: 13.5° C., boiling point T3: 214.5° C.], 2-pyrrolidone [melting point T2: 24.6° C., boiling point T3: 245° C.], and the like.

Examples of the hydrophilic aprotic solvent as the component (B) which satisfies the relation of T2<T1<T3 include dimethyl sulfoxide (DMSO) [melting point T2: 19° C., boiling point T3: 189° C.], N,N-dimethylformamide (DMF) [melting point T2: −61° C., boiling point T3: 153° C.], and the like.

<Component (C)>

Hereinafter, the conductive organic polymer compound as the component (C) is described.

The present invention is characterized in that the conductive organic polymer compound as the component (C) is at least one member selected among polyanilines, polypyrroles, polythiophenes, and derivatives thereof.

The polyanilines, polypyrroles, polythiophenes, and derivatives thereof are a conductive polymer having conductivity by π-electron conjugation.

The polyanilines are a high-molecular weight product of a compound in which aniline is substituted at the 2-position, 3-position, or N-position thereof with an alkyl group, an alkoxy group, or an aryl group each having a carbon number of from 1 to 18, a sulfonic acid group, or the like. Examples thereof include poly(2-methylaniline), poly(3-methylaniline), poly(2-ethylaniline), poly(3-ethylaniline), poly(2-methoxyaniline), poly(3-methoxyaniline), poly(2-ethoxyaniline), poly(3-ethoxyaniline), poly(N-methylaniline), poly(N-propylaniline), poly(N-phenyl-1-naphthylaniline), poly(8-anilino-1-naphthalenesulfonic acid), poly(2-aminobenzenesulfonic acid), poly(7-anilino-4-hydroxy-2-naphthalenesulfonic acid), and the like.

Examples of derivatives of the polyanilines include dopant products, etc. of the foregoing polyanilines. Examples of the dopant products include halide ions such as a chloride ion, and a bromide ion, an iodide ion; a perchloric acid ion; a tetrafluoroboric acid ion; a hexafluoroarsenic acid ion; a sulfuric acid ion; a nitric acid ion; a thiocyanic acid ion; a hexafluorosilicic acid ion; phosphoric acid based ions such as a phosphoric acid ion, a phenyl phosphate ion, a hexafluorophosphoric acid ion, etc.; a trifluoroacetic acid ion; alkylbenzenesulfonic acid ions such as a tosylate ion, an ethylbenzenesulfonic acid ion, and a dodecylbenzenesulfonic acid ion; alkylsulfonic acid ions such as a methylsulfonic acid ion and an ethylsulfonic acid ion; and polymer ions such as a polyacrylic acid ion, a polyvinylsulfonic acid ion, a polystyrenesulfonic acid (PSS) ion, a poly(2-acrylamide-2-methylpropanesulfonic acid) ion, etc. These may be used alone or in combination of two or more kinds thereof.

Of these, a polymer ion such as a polyacrylic acid ion, a polyvinylsulfonic acid ion, a polystyrenesulfonic acid (PSS) ion, a poly(2-acrylamido-2-methylpropanesulfonic acid) ion, etc. is preferable as the dopant because it is able to easily adjust the high conductivity, and it has a hydrophilic skeleton useful for being easily dispersed when formed into an aqueous solution. A polystyrenesulfonic acid (PSS) ion is more preferable.

The polypyrroles are a high-molecular weight product of a compound in which pyrrole is substituted at the 1-position, 3-position, or 4-position thereof with an alkyl group or an alkoxy group each having a carbon number of from 1 to 18, or the like. Examples thereof include poly(1-methylpyrrole), poly(3-methylpyrrole), poly(1-ethylpyrrole), poly(3-ethylpyrrole), poly(1-methoxypyrrole), poly(3-methoxypyrrole), poly(1-ethoxypyrrole), and poly(3-ethoxypyrrole), etc.

Examples of derivatives of the polypyrroles include dopant products of the foregoing polypyrroles, and the like. As for the dopant, those exemplified above for the dopant of the polyanilines can be used.

The polythiophenes are a high-molecular weight product of a compound in which thiophene is substituted at the 3-position or 4-position thereof with an alkyl group or an alkoxy group having a carbon number of from 1 to 18, or the like. Examples thereof include poly(3-methylthiophene), poly(3-ethylthiophene), poly(3-methoxythiophene), poly(3-ethoxythiophene), poly(3,4-ethylenedioxythiophene) (PEDOT), and the like.

Examples of derivatives of the polythiophenes include dopant products of the foregoing polythiophenes, and the like. As for the dopant, those exemplified above for the dopant of the polyanilines can be used.

Of these, a mixture (hereinafter sometimes referred to as "PEDOT:PSS") of poly(3,4-ethylene oxide thiophene) and, as a dopant, a polystyrenesulfonic acid ion or the like is preferable as the conductive organic polymer compound because not only it is able to easily adjust the high conductivity in an extremely small amount, but it has a hydrophilic skeleton useful for being easily dispersed when formed into an aqueous solution.

The foregoing conductive adhesive composition for forming the conductive layer in the transparent conductive film according to the present invention is a composition containing (A) a water-soluble vinyl polymer, (B) an organic additive, and (C) a conductive organic polymer compound. A blending amount of each of the components (on the basis of the active ingredients) is as follows.

When a total amount of the components (A), (B) and (C) is defined as 100 parts by mass, a blending amount of the component (A) is from 1 to 60 parts by mass, preferably from 5 to 50 parts by mass, and more preferably from 10 to 40 parts by mass. A blending amount of the component (B) is from 0.1 to 90 parts by mass, preferably from 10 to 70 parts by mass, and more preferably from 20 to 65 parts by mass. A blending amount of the component (C) is from 0.1 to 90 parts by mass, preferably from 0.5 to 75 parts by mass, and more preferably from 5 to 55 parts by mass.

In the case where the blending amount of the component (A) is less than 1 part by mass, the adhesiveness is not revealed, whereas in the case where on the contrary, it exceeds 60 parts by mass, the transparency and the conductivity are lowered, and hence, the both are not preferable.

In the case where the blending amount of the component (B) is less than 0.1 parts by mass, the conductivity is lowered, whereas in the case where on the contrary, it exceeds 90 parts by mass, the adhesiveness is lowered, and hence, the both are not preferable.

In the case where the blending amount of the component (C) is less than 0.1 parts by mass, the conductivity is lowered, whereas in the case where on the contrary, it exceeds 90 parts by mass, the adhesiveness is not revealed, and hence, the both are not preferable.

In addition, in the present invention, the foregoing conductive adhesive composition may also be a solution in which a solvent such as water, toluene, ethyl acetate, methyl ethyl ketone, etc. is further blended together with the components (A), (B) and (C). Above all, in view of solubility of the components (A), (B) and (C), it is preferable that the solution is an aqueous solution. In view of handling, a concentration of the active ingredients is preferably from 0.5 to 80% by mass, and more preferably from 1 to 70% by mass.

Furthermore, in the present invention, in addition to the foregoing components (A), (B) and (C) and solvent, if desired, a tackifier, a plasticizer, a thickener, a wetting agent, a defoaming agent, a film-forming auxiliary, an antiseptic, an anticorrosive, a freezing and thawing stabilizer, a pigment, a coloring agent, a filler, a metal powder, an antioxidant, a light stabilizer, an ultraviolet ray absorbent, and the like can be properly added in the conductive adhesive composition.

Examples of a method for forming the foregoing conductive layer 1 include coating of every sort such as dip coating, spin coating, spray coating, gravure coating, die coating, doctor blade coating, etc. and a wet process such as electrochemical deposition, etc. The method is properly selected.

Above all, it is preferable to form the conductive layer 1 by applying a solution (coating solution) having the foregoing conductive adhesive composition dissolved or dispersed in an appropriate solvent such as purified water, etc. on the openings of the foregoing conductive metal mesh layer 2 provided on the transparent base material 3 by means of the foregoing coating of every sort, drying the obtained coating film, and if desired, further heating it to such an extent that the organic additive in the conductive adhesive composition does not volatilize. According to such a method, the conductive layer 1 can be easily formed in the openings 9 of the foregoing conductive metal mesh layer 2.

A thickness of the conductive layer 1 composed of the foregoing conductive adhesive composition is preferably from 5 to 10,000 nm, and more preferably from to 3,000 nm. When the thickness of the conductive layer 1 is less than 5 nm, the adhesiveness is not revealed, whereas when it exceeds 10,000 nm, the conductivity is lowered.

The conductive layer has high conductivity such that it is applicable to an electronic device. A surface resistivity of such a conductive layer 1 is preferably from 1 to $1.0 \times 10^{10}$ Ω/square, more preferably from 1 to $1.0 \times 10^{9}$ Ω/square, and still more preferably from 1 to $1.0 \times 10^{8}$ Ω/square. When the surface resistivity of the conductive layer 1 exceeds $1.0 \times 10^{10}$ Ω/square, the conductivity is low, so that when used for an electronic device, the performance is deteriorated.

A total light transmittance of the conductive layer 1 is 80% or more, and preferably, it is close to 100% as far as possible. When the total light transmittance is 80% or more, in the case where the conductive layer 1 is used for various electronic devices such as solar cells, etc., its transparency is sufficient, and it is suitably used.

The transparent conductive film of the present invention has the conductive metal mesh layer 2 and the conductive layer 1 on at least one surface of the transparent base material 3.

As shown in FIG. 1, it is preferable that the conductive metal mesh layer 2 and the conductive layer 1 are provided on one surface of the transparent base material 3 and that the conductive layer 1 is filled and formed in the openings 9 of the conductive metal mesh layer 2.

Figure 3:
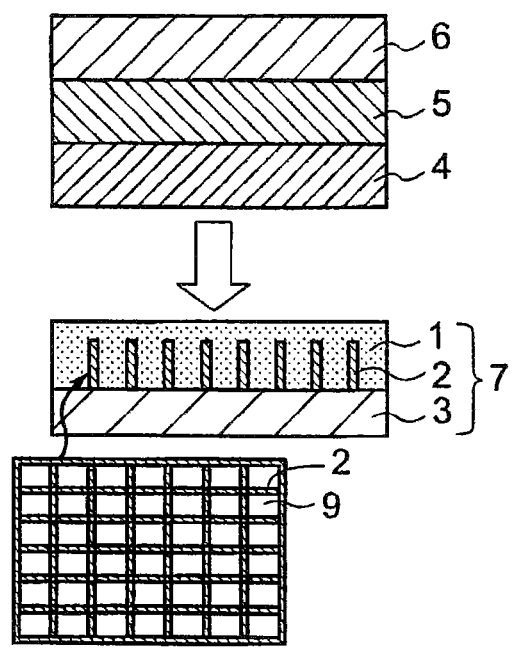
FIG. 3 is a schematic view showing a cross section at the case of manufacturing an electronic device by a method for manufacturing an electronic device of the present invention.

In addition, the conductive layer 1 may be filled and be formed in the openings of the conductive metal mesh layer 2, and it may also be formed in such a manner that an upper part of the conductive metal mesh layer 2 is hidden (see 7 of FIG. 3).

That is, in view of the fact that the transparent conductive film 7 of the present invention has the conductive metal mesh layer 2 and the conductive layer 1 on at least one surface of the transparent base material 3, and the conductive layer 1 is filled and is formed in the openings 9 of the conductive metal mesh layer 2 and, whereby, the conductivity is enhanced.

As mentioned hereinabove, the transparent conductive film of the present invention is high in terms of transparency and low in terms of surface resistivity, and therefore, it is excellent in terms of a balance between transparency and conductivity. In addition, the transparent conductive film itself of the present invention has excellent adhesiveness, and therefore, it is able to manufacture an electronic device by a lamination process.

A surface resistivity on the side of the surface of the transparent conductive film of the present invention, on which the conductive layer and the metal mesh layer are provided, is preferably from 1 to $1.0 \times 10^{9}$ Ω/square. When the surface resistivity exceeds $1.0 \times 10^{9}$ ΩΩ/square, the conductivity is low, so that when used for an electronic device, the performance is deteriorated.

<Electronic Device>

The electronic device of the present invention is hereunder described.

The electronic device of the present invention is one having the foregoing transparent conductive film.

Examples of the electronic device include organic devices such as organic transistors, organic memories, organic EL, etc.; liquid crystal displays; electronic papers; thin-film transistors; electrochromics; electrochemical light-emitting devices; touch panels; displays; solar cells; thermoelectric conversion devices; piezoelectric conversion devices; electric storage devices; and the like.

Figure 2:
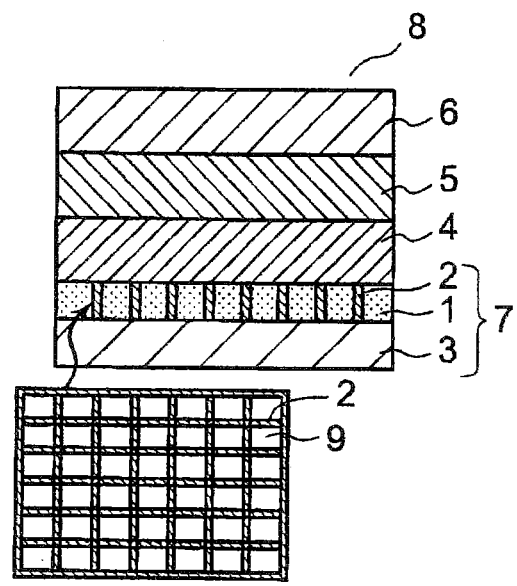
FIG. 2 is a schematic view showing a cross section of an example of an electronic device of the present invention.

FIG. 2 is an example of an electronic device having the transparent conductive film of the present invention. In FIG. 2, 1 stands for a conductive layer, 2 stands for a conductive metal mesh layer, 3 stands for a transparent base material, 4 stands for a photoelectric conversion layer, 5 stands for an electrode, 6 stands for a base material, 7 stands for a transparent conductive film, and 8 stands for an electronic device.

<Photoelectric Conversion Layer>

The photoelectric conversion layer is a layer receiving a photoelectric effect, and it may be composed of a single layer or plural layers. In the case of a single layer, the photoelectric conversion layer is usually formed of an intrinsic semiconductor layer (i-type semiconductor).

The photoelectric conversion layer is a layer for achieving the photoelectric conversion, and it is preferably composed of an organic semiconductor from the viewpoints of cost reduction of raw materials, flexibility, easiness of formation, high extinction coefficient, weight reduction, impact resistance, and the like.

In addition, in the case of plural layers, the photoelectric conversion layer is a (p-type semiconductor layer/n-type semiconductor layer) laminate, a (p-type semiconductor layer/intrinsic semiconductor layer/n-type semiconductor layer) laminate, or the like.

Though a thickness of the photoelectric conversion layer differs depending upon whether the photoelectric conversion layer is composed of a single layer or plural layers, from the viewpoints of conductivity and exciton diffusion distance, in general, it is preferably from 30 nm to 2 µm, and especially preferably from 40 nm to 300 nm.

An organic semiconductor used in the photoelectric conversion layer is hereunder described.

(1) Intrinsic Semiconductor:

As a material for the intrinsic semiconductor, for example, there can be used a mixture obtained by mixing a first material composed of at least one member of fullerene, a fullerene derivative, a carbon nanotube (CNT) having semiconductive properties, and a CNT compound, and a second material composed of a derivative of polyphenylene vinylene (PPV) or a polythiophene based polymer material such that the obtained semiconductor becomes an intrinsic semiconductor.

As the fullerene derivative, for example, [6,6]-phenyl-C61-butyric acid methyl ester (PCBM) and the like can be used, and a dimer of fullerene or a fullerene compound having an alkali metal or an alkaline earth metal, etc. introduced thereinto, and the like can also be used. In addition, as CNT, a carbon nanotube having fullerene or metal-included fullerene included therein, and the like can be used. Furthermore, a CNT compound in which a molecule of every sort is added to the side wall or tip of CNT, and the like can also be used.

As the derivative of polyphenylene vinylene, poly[2-methoxy-5-(2'-ethyl-hexyloxy)-p-phenylene-vinylene] (MEH-PPV) and the like can be used; and as the polythiophene based polymer material, a poly(3-alkylthiophene) such as poly-3-hexylthiophene (P3HT), etc., a dioctylfluorene-bithiophene copolymer (F8T2), and the like can be used.

As an especially preferred intrinsic semiconductor, there is exemplified a mixture obtained by mixing PCBM and P3HT in a mass ratio of from 1/0.3 to 1/4.

(2) p-Type Semiconductor:

Examples of a material of the p-type semiconductor include polyalkylthiophenes such as poly-3-hexylthiophene (P3HT), etc. and derivatives thereof, polyphenylene and derivatives thereof, polyphenylene vinylenes such as poly[2-methoxy-5-(2'-ethyl-hexyloxy)-p-phenylene-vinylene] (MEH-PPV), etc., and derivatives thereof, polysilane and derivatives thereof, porphyrin derivatives, phthalocyanine derivatives, polyalkylthiophenes and derivatives thereof, organic metal polymers, and the like. Above all, polyalkylthiophenes and derivatives thereof are preferable. In addition, mixtures of those organic materials may also be used. As the conductive polymer, poly(3,4-ethylenedioxythiophene)/polystyrenesulfonate (PEDOT:PSS) can be preferably used.

(3) n-Type Semiconductor:

A material of the n-type semiconductor is not particularly limited, and examples thereof include 1,4,5,8-naphthalenetetracarboxylic dianhydride (NTCDA), 3,4,9,10-perylenetetracarboxylic dianhydride (PTCDA), 3,4,9,10-perylenetetracarboxylic bisbenzimidazole (PTCBI), N,N'-dioctyl-3,4,9,10-naphthyltetracarboxydiimide (PTCDI-C8H), oxazole derivatives such as 2-(4-biphenylyl)-5-(4-t-butylphenyl)-1,3,4-oxadiazole (PBD), 2,5-di(1-naphthyl)-1,3,4-oxadiazole (BND), etc., triazole derivatives such as 3-(4-biphenylyl)-4-phenyl-5-(4-t-butylphenyl)-1,2,4-triazole (TAZ), etc., phenanthroline derivatives, phosphine oxide derivatives, fullerene compounds, carbon nanotubes (CNT), CNT compounds in which a molecule of every sort is added to the side wall or tip of CNT, derivatives (CN-PPV) in which a cyano group is introduced into a poly-p-phenylene vinylene based polymer, and the like.

Of these, fullerene compounds are especially preferable because they are an n-type semiconductor which is stable and high in terms of carrier mobility.

As for the fullerene compound, for example, [6,6]-phenyl-C61-butyric acid methyl ester (PCBM) and the like can be used. In addition, examples thereof include a dimer of fullerene, a fullerene compound having an alkali metal or an alkaline earth metal introduced thereinto, and the like. Of these, PCBM is preferable from the viewpoint that it has excellent electron acceptance.

Incidentally, such an n-type semiconductor can be used alone or in combination of two or more kinds thereof.

As for a method for forming the photoelectric conversion layer 4, there can be properly selected various coating processes including a dry process such as PVD (physical vapor deposition), e.g., vacuum vapor deposition, sputtering, ion plating, etc., CVD (chemical vapor deposition), e.g., thermal CVD, atomic layer deposition (ALD), etc., etc.; a coating process of every sort, such as dip coating, spin coating, spray coating, bar coating, gravure coating, die coating, and doctor blade coating, etc.

<Electrode>

As for a material of the electrode, those having a relatively small work function are preferable. Examples thereof include, in addition to metals, metal oxides, or alloys such as platinum, gold, aluminum, iridium, chromium, zinc oxide, etc., carbon nanotubes, and composites of a carbon nanotube and the foregoing metals, metal oxides or alloys.

A thickness of the electrode is preferably from 20 nm to 1 μm, and especially preferably from 30 to 200 nm.

Examples of a method for forming the electrode 5 include a dry process such as PVD (physical vapor deposition), e.g., vacuum vapor deposition, sputtering, ion plating, etc., CVD (chemical vapor deposition), e.g., thermal CVD, atomic layer deposition (ALD), etc.; and a wet process such as coating of every sort, e.g., dip coating, spin coating, spray coating, bar coating, gravure coating, die coating, doctor blade coating, etc., electrochemical deposition, etc. The method is properly selected according to the material of the electrode 5.

<Base Material Layer>

As for the base material layer 6, in general, there is exemplified glass (plate) or a plastic film, and the material can be properly selected according to an application of the electronic device. Examples of the plastic film include films made of a polyethylene terephthalate, a polyethylene naphthalate, a tetraacetyl cellulose, a syndiotactic polystyrene, a polyphenylene sulfide, a polycarbonate, a polyarylate, a polysulfone, a polyestersulfone, a polyetherimide, a cyclic polyolefins, or the like. Those which are excellent in terms of mechanical strength, durability, and the like are preferable. Above all, those having high transparency are preferable.

In view of a balance between mechanical strength and transparency, a thickness of the base material layer 6 is preferably from 3 μm to 5 mm, more preferably from 5 μm to 1 mm, and especially preferably from 10 μm to 300 μm.

<Manufacturing Method of Electronic Device>

The method for manufacturing an electronic device according to the present invention comprises sticking a conductive layer in a transparent conductive film and a surface of a photoelectric conversion layer to each other. That is, the method comprises sticking a conductive layer of a transparent conductive film and a surface of the foregoing photoelectric conversion layer to each other at a temperature at which the foregoing conductive adhesive composition is softened or higher.

The method for manufacturing an electronic device of the present invention is hereunder described with reference to FIG. 3. In FIG. 3, a downward arrow expresses that the photoelectric conversion layer 4 and the conductive layer 1 are compressively bonded and stuck at a temperature at which the conductive adhesive composition is softened or higher, thereby forming an electronic device.

First of all, the electrode 5 is formed on the base material layer 6, and the foregoing photoelectric conversion layer 4 is formed on this electrode 5. Subsequently, the conductive layer 1 in the transparent conductive film and the surface of the foregoing photoelectric conversion layer 4 are stuck to each other at a temperature at which the foregoing conductive adhesive composition is softened or higher, whereby an electronic device is manufactured.

The temperature at which the foregoing conductive adhesive composition is softened is a glass transition temperature (Tg) of the water-soluble vinyl polymer or higher. In view of easiness of manufacture, the temperature is specifically from about 60 to 140° C.

According to the method for manufacturing an electronic device of the present invention, since the surface of the conductive layer 1 of the transparent conductive film and the surface of the photoelectric conversion layer 4 are stuck to each other, the electronic device can be easily manufactured by a lamination process.

In addition, according to this method, the electrode 5 is formed on the base material layer 6, and the photoelectric conversion layer 4 is formed on this electrode 5, and therefore, there does not exist a step of forming the electrode 5 on the photoelectric conversion layer 4.

In consequence, the electrode 5 does not become non-uniform, or the photoelectric conversion layer 4 is not damaged by the energy at the time of formation of the electrode 5, and thus, the performance of the electronic device is not lowered.

EXAMPLES

The present invention is hereunder described in more detail with reference to the following Examples and Comparative Examples, but it should be noted that the present invention is not limited thereto at all.

Example 1

Preparation of Conductive Adhesive Composition

As for the water-soluble vinyl polymer which is the component (A), there was used 50 parts by mass of polyvinyl alcohol [a product name: Polyvinyl Alcohol, manufactured by Sigma-Aldrich Co., weight average molecular weight: 9,100, Tg (T1): 50° C.; which is described as "PVA" in Table 1]. As for the organic additive which is the component (B), there was used 50 parts by mass of glycerin [a product name: Glycerin, manufactured by Sigma-Aldrich Co., melting point (T2): 18° C., boiling point (T3): 290° C.]. As for the conductive organic polymer compound which is the component (C), there was used 10,000 parts by mass of a mixture (PEDOT: PSS) of poly(3,4-ethylene oxide thiophene) (PEDOT) and polystyrenesulfonic acid (PSS) [a product name: Clevious P VP.AI4083, manufactured by H.C. Starck, active ingredient: 1% by mass (solvent: purified water); which is described as "Polythiophene" in Table 1], that is a derivative of polythiophene.

To the foregoing components (A), (B) and (C), 200 parts by mass of purified water was added, thereby preparing a coating solution of a conductive adhesive composition (active ingredient: 1.9% by mass).

[Preparation of Transparent Conductive Film]

On one surface of a transparent base material [a product name: Cosmoshine A4100, manufactured by Toyobo Co., Ltd.], copper was subjected to film formation under reduced pressure of not more than $1\times10^{-3}$ Pa by a vapor deposition method, thereby forming a copper layer having a thickness of 100 nm. Subsequently, a resist treatment and an etching treatment were performed to prepare a conductive metal mesh layer [pitch of openings: 1,200 μm/20 μm in line width, total light transmittance: 89%, surface resistivity: 2 Ω/square].

Subsequently, the above-prepared coating solution of conductive adhesive composition was applied onto the openings of the conductive metal mesh layer using a Meyer bar (20 mil) and then dried by a dryer at 120° C. for 10 minutes.

In this way, a transparent conductive film having a conductive layer (thickness: 500 nm) composed of the conductive adhesive composition was prepared in the openings of the conductive metal mesh layer.

Subsequently, on a polyethylene terephthalate film [a product name: Cosmoshine A4100, manufactured by Toyobo Co., Ltd.] as a base material, aluminum was subjected to film formation under reduced pressure of not more than $1\times10^{-3}$ Pa by a vapor deposition method, thereby forming an aluminum layer (electrode) having a thickness of 100 nm.

Subsequently, on the above-obtained electrode, a chlorobenzene solution (concentration: 2% by mass) of a mixture of poly-3-hexylthiophene (P3HT) and [6,6]-phenyl-C61-butyric acid methyl ester (PCBM) in a mass ratio of 1/0.8 was applied by a spin casting method and then dried at 120° C. for 10 minutes, thereby forming a photoelectric conversion layer having a thickness of 100 nm.

[Fabrication of Electronic Device]

A surface of the photoelectric conversion layer and a surface of the conductive layer in the transparent conductive film were compressively bonded and stuck to each other upon heating a roll laminator [a product name: RSL-328S, manufactured by Royal Sovereign] at a roller temperature of 120° C., thereby obtaining an electronic device.

Examples 2 and 3

Transparent conductive films were prepared and electronic devices were fabricated in the same manner as that in Example 1, except for using a conductive adhesive composition prepared in blending ratios (parts by mass, hereinafter the same) shown in Table 1.

Example 4

A transparent conductive film was prepared and an electronic device was fabricated in the same manner as that in Example 1, except for changing the amount of PVA as the component (A) to 25 parts by mass and using 80 parts by mass of N-methylpyrrolidone [manufactured by Wako Pure Chemical Industries, Ltd., melting point (T2): −24° C., boiling point (T3): 202° C.] as for the organic additive which is the component (B) in place of the glycerin.

Example 5

A transparent conductive film was prepared and an electronic device was fabricated in the same manner as that in Example 1, except for using 50 parts by mass of polyvinylpyrrolidone [manufactured by Sigma-Aldrich Co., Tg (T1): 80° C.; which is described as "PVP" in Table 1] as for the water-soluble vinyl polymer which is the component (A) in place of PVA and changing the amount of glycerin as for the organic additive which is the component (B) to 100 parts by mass.

Example 6

A transparent conductive film was prepared and an electronic device was fabricated in the same manner as that in Example 5, except for using 100 parts by mass of N-methylpyrrolidone [manufactured by Wako Pure Chemical Industries, Ltd., melting point (T2): −24° C., boiling point (T3): 202° C.] as for the organic additive which is the component (B) in place of the glycerin.

Example 7

A transparent conductive film was prepared and an electronic device was fabricated in the same manner as that in Example 1, except for using 100 parts by mass of dimethyl sulfoxide [manufactured by Wako Pure Chemical Industries, Ltd., melting point (T2): 19° C., boiling point (T3): 189° C.; which is described as "DMSO" in Table 1] as for the organic additive which is the component (B) in place of the glycerin.

Example 8

A transparent conductive film was prepared and an electronic device was fabricated in the same manner as that in Example 1, except for using 100 parts by mass of dimethylformamide [manufactured by Wako Pure Chemical Industries, Ltd., melting point (T2): −61° C., boiling point (T3): 153° C.; which is described as "DMF" in Table 1] as for the organic additive which is the component (B) in place of the glycerin.

Example 9

A transparent conductive film was prepared and an electronic device was fabricated in the same manner as that in Example 1, except for changing the derivative of polythiophene that is the conductive organic polymer compound as the component (C) to PEDOT:PSS [a product name: 5305, manufactured by Agfa Materials Japan, Limited].

Example 10

A transparent conductive film was prepared and an electronic device was fabricated in the same manner as that in Example 1, except for using 100 parts by mass of polyaniline [manufactured by Sigma-Aldrich, Co.; which is described as "Polyaniline" in Table 1] in place of the derivative of polythiophene as for the conductive organic polymer compound which is the component (C) and changing the amount of glycerin which is the component (B) to 100 parts by mass.

Example 11

A transparent conductive film was prepared and an electronic device was fabricated in the same manner as that in Example 1, except for using 10,000 parts by mass of polypyrrole [manufactured by Sigma-Aldrich, Co., active ingredient: 1% by mass; which is described as "Polypyrrole" in Table 1] in place of the derivative of polythiophene as for the conductive organic polymer compound which is the component (C) and changing the amount of glycerin which is the component (B) to 100 parts by mass.

Comparative Examples 1 to 3 and 5 to 6

Comparative transparent conductive films were prepared and electronic devices were fabricated in the same manner as that in Example 1, by using a conductive adhesive composition prepared in a blending ratio of the component (A), (B) or (C) as shown in Table 1.

Comparative Example 4

Comparative transparent conductive film was prepared and an electronic device was fabricated in the same manner as that in Example 1, except for not providing a conductive layer composed of a conductive adhesive composition. That is, the electronic device was fabricated by using the conductive metal mesh layer alone as the comparative transparent conductive film.

Comparative Examples 7 to 10

Comparative transparent conductive films were prepared and electronic devices were fabricated in the same manner as that in Example 1, by using a conductive adhesive composition prepared in a blending ratio of the component (A), (B) or (C) as shown in Table 1 and forming a conductive layer directly on a transparent base material on which a conductive metal mesh layer had not been provided.

In the light of the above, Examples 1 to 4 and 7 to 11 and Comparative Examples 1, 2, 5, 7, 8 and 10 are an example using PVA as for the water-soluble vinyl polymer which is the component (A).

Table 1 shows the blending ratios of the respective components in the conductive adhesive composition used in each of the Examples and Comparative Examples and characteristics of the obtained transparent conductive films and electronic devices.

In Table 1, all of the blending amounts of the components (A), (B) and (C) express parts by mass of the active ingredients. A numerical value in each of the parentheses expresses parts by mass or % by mass of each of the components when a total sum of the components (A), (B) and (C) is defined as 100. Examples 5 and 6 are an example using PVP as for the water-soluble vinyl polymer which is the component (A).

Example 12

Preparation of Conductive Adhesive Composition

As for the component (A), 113 parts by mass of an acrylic acid polymer ["Polyacrylic Acid", manufactured by Sigma-Aldrich Co., weight average molecular weight: 100,000, Tg: 102° C., active ingredient: 40% by mass; which is described as "PAA" in Table 2] was used, and as for the organic additive as the component (B), 90 parts by mass of glycerin [a product name: Glycerin, manufactured by Sigma-Aldrich Co., melting point (T2): 18° C., boiling point (T3): 290° C.] was used. As for the conductive organic polymer compound as the component (C), 1,500 parts by mass of a mixture (PEDOT:PSS) of poly(3,4-ethylene oxide thiophene) (PEDOT) and polystyrenesulfonic acid (PSS) [a product name: Clevious P VP.AI4083, manufactured by H.C. Starck, active ingredient: 1% by mass (solvent: purified water); which is described as "Polythiophene" in Table 2], that is a derivative of polythiophene, was used.

To the foregoing components (A), (B) and (C), 200 parts by mass of purified water was added, thereby preparing a coating solution of a conductive adhesive composition (active ingredient: 7.9% by mass).

A transparent conductive film and an electronic device were fabricated in the same method as that in Example 1.

Examples 13 and 14

Transparent conductive films and electronic devices were fabricated in the same manner as that in Example 12, except for using a conductive adhesive composition prepared in blending ratios of the components (A), (B) and (C) (parts by mass, hereinafter the same) shown in Table 2.

Examples 15 to 19

Transparent conductive films and electronic devices were fabricated in the same manner as that in Example 12, except for using a conductive adhesive composition prepared in blending ratios of the components (A), (B) and (C) (parts by mass of the active ingredients, hereinafter the same) shown in Table 2.

Comparative Examples 11 to 20

Comparative transparent conductive films and electronic devices were fabricated in the same manner as that in Example 12, by using a conductive adhesive composition prepared in a blending ratio of the component (A), (B) or (C) shown in Table 2.

Table 2 shows the blending ratios of the respective components in the conductive adhesive composition used in each of the Examples and Comparative Examples and characteristics of the obtained transparent conductive films and electronic devices. In Table 2, all of the blending amounts of the components (A), (B) and (C) express parts by mass of the active ingredients. A numerical value in each of the parentheses expresses parts by mass or % by mass of each of the components when a total sum of the components (A), (B) and (C) is defined as 100.

The characteristics described in Tables 1 and 2 were measured in the following manners.

(1) Thickness of Conductive Layer and Conductive Metal Mesh Layer:

A thickness of each of the conductive layer composed of the conductive adhesive composition and the conductive metal mesh layer was measured by a stylus surface profilometer [a product name: "Dektak 150", manufactured by Veeco].

(2) Surface Resistivity:

A surface resistivity was measured by the four-probe method with a surface resistance meter [a product name: "Loresta GP MCP-T600", manufactured by Mitsubishi Chemical Corporation]. In the Examples, the surface on which the conductive layer of the transparent conductive film and the metal mesh layer were provided was measured. In Comparative Examples 4 and 14, the surface of the conductive metal mesh layer (copper layer) was measured. In Comparative Examples 7 to 10 and 17 to 20, the surface of the conductive layer was measured.

(3) Total Light Transmittance:

A total light transmittance of the transparent conductive film was measured with a light transmittance meter [a product name: "NDH-5000", manufactured by Nippon Denshoku Industries Co., Ltd.] in conformity with JIS K7631-1.

(4) Evaluation of Sticking (Adhesiveness):

Each of the transparent conductive films (5×5 cm) obtained in the Examples and Comparative Examples was stuck onto a glass plate (25 mm×25 mm, thickness: 1 mm) at a temperature of 120° C. by using a laminator [a product name: "RSL-328J", manufactured by Royal Sovereign]. Thereafter, after cooling to ordinary temperature, the transparent conductive film was vertically aligned and examined on whether it adhered or not.

◯: The glass plate adheres without dropping.

x: The glass plate separated without adhering.

(5) Evaluation of Electronic Device:

As for each of the electronic devices obtained in the Examples and Comparative Examples, a current-voltage characteristic was measured using a source measure unit [manufactured by Wacom Electric Co., Ltd.], and a commutation curve was observed.

◯: Commutation properties are revealed.

x: Commutation properties are not revealed (the device does not function as an electronic device due to poor sticking).

(6) Adhesive Force:

As for the adhesive force described in Table 2, the coating solution of conductive adhesive composition obtained in each of Examples 12 to 19 and Comparative Examples 11 to 20 was applied on a polyethylene terephthalate film [a product name: "Cosmoshine A4100", manufactured by Toyobo Co., Ltd., thickness: 100 μm] and then dried at 100° C. for 10 minutes, thereby forming a conductive layer composed of the conductive adhesive composition and having a film thickness of 500 nm. There was thus fabricated a sample for measurement.

The obtained sample for measurement was cut into a size of 25 mm×300 mm in an environment at 23° C. and 50% RH (relative humidity) in conformity with JIS 20237 (2009), and the resulting sample for measurement was stuck onto an adherend (glass plate, 800 mm×1,500 mm, thickness: 3 mm) at a temperature of 100° C. by using a laminator [a product name: "RSL-328J", manufactured by Royal Sovereign]. An adhesive force at a point of time of elapsing 24 hours after sticking was measured at a tensile rate of 300 mm/min by the 180-degree peeling method.

(7) Glass Transition Temperature:

The glass transition temperature T1 of the water-soluble vinyl polymer as the component (A) was determined by measuring an extrapolated glass transition initiation temperature in a temperature range of from −80° C. to 250° C. with an input compensation type differential scanning calorimeter [an apparatus name: "Pyris1 DSG", manufactured by PerkinElmer] in conformity with JIS K7121.

TABLE 1

| | | | | Transparent conductive film | | | |
|---|---|---|---|---|---|---|---|
| | | | | Conductive layer | | | |
| | (A) | | (B) | | | | (C) |
| | PVA | PVP | Glycerin | N-Methyl-pyrrolidone | DMSO | DMF | Polythiophenes |
| Example | | | | | | | |
| 1 | 50 (25) | — | 50 (25) | — | — | — | 100 (50) |
| 2 | 25 (14.7) | — | 25 (14.7) | — | — | — | 120 (70.6) |
| 3 | 50 (25) | — | 100 (50) | — | — | — | 50 (25) |
| 4 | 25 (12.19) | — | — | 80 (39.01) | — | — | 100 (48.8) |
| 5 | — | 50 (20) | 100 (40) | — | — | — | 100 (40) |
| 6 | — | 50 (20) | — | 100 (40) | — | — | 100 (40) |
| 7 | 50 (20) | — | — | — | 100 (40) | — | 100 (40) |
| 8 | 50 (20) | — | — | — | — | 100 (40) | 100* (40) |
| 9 | 50 (25) | — | 50 (25) | — | — | — | 100 (50) |
| 10 | 50 (20) | — | 100 (40) | — | — | — | — |
| 11 | 50 (20) | — | 100 (40) | — | — | — | — |

TABLE 1-continued

| Comparative Example | | | | | | | |
|---|---|---|---|---|---|---|---|
| 1 | 100 (77) | — | — | — | — | — | 30 (23) |
| 2 | 50 (62.5) | — | — | — | — | — | 30 (37.5) |
| 3 | — | — | — | — | — | — | 15 (100) |
| 4 | — | — | — | — | — | — | — |
| 5 | 50 (100) | — | — | — | — | — | — |
| 6 | — | — | 100 (100) | — | — | — | — |
| 7 | 100 (77) | — | — | — | — | — | 30 (23) |
| 8 | 50 (62.5) | — | — | — | — | — | 30 (30.5) |
| 9 | — | — | — | — | — | — | 15 (100) |
| 10 | 50 (100) | — | — | — | — | — | — |

Transparent conductive film — Conductive layer

| | (C) | | T1 (° C.) | T2 (° C.) | T3 (° C.) | Thickness of conductive layer (nm) |
|---|---|---|---|---|---|---|
| | Polyanilines | Polypyrroles | | | | |
| Example | | | | | | |
| 1 | — | — | 50 | 18 | 290 | 500 |
| 2 | — | — | 50 | 18 | 290 | 500 |
| 3 | — | — | 50 | 18 | 290 | 500 |
| 4 | — | — | 50 | −24 | 202 | 500 |
| 5 | — | — | 80 | 18 | 290 | 500 |
| 6 | — | — | 80 | −24 | 202 | 500 |
| 7 | — | — | 50 | 19 | 189 | 500 |
| 8 | — | — | 50 | −61 | 153 | 500 |
| 9 | — | — | 50 | 18 | 290 | 500 |
| 10 | 100 (40) | — | 50 | 18 | 290 | 500 |
| 11 | — | 100 (40) | 50 | 18 | 290 | 500 |
| Comparative Example | | | | | | |
| 1 | — | — | 50 | — | — | 650 |
| 2 | — | — | 50 | — | — | 350 |
| 3 | — | — | — | — | — | 50 |
| 4 | — | — | — | — | — | — |
| 5 | — | — | 50 | — | — | 500 |
| 6 | — | — | — | 18 | 290 | ** |
| 7 | — | — | 50 | — | — | 650 |
| 8 | — | — | 50 | — | — | 350 |
| 9 | — | — | — | — | — | 50 |
| 10 | — | — | 50 | — | — | 500 |

Transparent conductive film

| | Thickness of conductive metal mesh layer (nm) | Surface resistivity of conductive metal mesh layer (Ω/square) | Total light transmittance (%) | Evaluation of sticking (adhesiveness) | Evaluation of electronic device | Layer configuration of transparent conductive film |
|---|---|---|---|---|---|---|
| Example | | | | | | |
| 1 | 100 | 4.50E+06 | 86 | ○ | ○ | PET + Conductive metal mesh layer + Conductive layer |
| 2 | 100 | 3.20E+06 | 87 | ○ | ○ | PET + Conductive metal mesh layer + Conductive layer |
| 3 | 100 | 4.50E+05 | 86 | ○ | ○ | PET + Conductive metal mesh layer + Conductive layer |
| 4 | 100 | 3.20E+05 | 86 | ○ | ○ | PET + Conductive metal mesh layer + Conductive layer |
| 5 | 100 | 1.70E+06 | 87 | ○ | ○ | PET + Conductive metal mesh layer + Conductive layer |
| 6 | 100 | 7.70E+05 | 86 | ○ | ○ | PET + Conductive metal mesh layer + Conductive layer |
| 7 | 100 | 1.80E+05 | 86 | ○ | ○ | PET + Conductive metal mesh layer + Conductive layer |
| 8 | 100 | 2.30E+05 | 86 | ○ | ○ | PET + Conductive metal mesh layer + Conductive layer |
| 9 | 100 | 1.0 | 83 | ○ | ○ | PET + Conductive metal mesh layer + Conductive layer |
| 10 | 100 | 3.20E+05 | 85 | ○ | ○ | PET + Conductive metal mesh layer + Conductive layer |
| 11 | 100 | 4.08E+07 | 84 | ○ | ○ | PET + Conductive metal mesh layer + Conductive layer |
| Comparative Example | | | | | | |
| 1 | 100 | 2.70E+09 | 73 | ○ | x | PET + Conductive metal mesh layer + Conductive layer [no component (B)] |
| 2 | 100 | 5.50E+08 | 80 | ○ | x | PET + Conductive metal mesh layer + Conductive layer [no component (B)] |
| 3 | 100 | 4.50E+07 | 88 | x | x | PET + Conductive layer [neither component (A) nor component (B)] |

TABLE 1-continued

| | | | | | | |
|---|---|---|---|---|---|---|
| 4 | 100 | 2 | 89 | x | — | The conductive layer is the conductive metal mesh layer alone |
| 5 | 100 | 3.80E+12 | 88 | ○ | x | PET + Conductive metal mesh layer + Conductive layer [neither component (B) nor component (C)] |
| 6 | 100 | — | — | x | — | |
| 7 | — | 2.70E+11 | 75 | ○ | x | PET + Conductive layer [no component (B)] |
| 8 | — | 5.50E+10 | 82 | ○ | x | PET + Conductive layer [no component (B)] |
| 9 | — | 4.50E+09 | 90 | x | x | PET + Conductive layer [neither component (A) nor component (B)] |
| 10 | — | 3.80E+14 | 90 | ○ | x | |

*Polythiophenes: a product name "S305"
** A conductive layer could not be formed due to poor film formation properties.
All of the blending amounts of the components (A), (B) and (C) express parts by mass of each of the active ingredients, and a numerical value in each of the parentheses in the Examples expresses parts by mass or % by mass of each of the components when a total sum of the components (A), (B) and (C) is defined as 100 parts by mass.

TABLE 2

| | Transparent conductive film Conductive layer | | | | | | | | | | | |
|---|---|---|---|---|---|---|---|---|---|---|---|---|
| | (A) | (B) | | | | (C) | | | | | | Thickness of |
| | PAA | Glycerin | N-Methyl-pyrrolidone | DMSO | DMF | Poly-thiophenes | Poly-anilines | Poly-pyrroles | T1 (° C.) | T2 (° C.) | T3 (° C.) | conductive layer (nm) |
| Example | | | | | | | | | | | | |
| 12 | 45 (30) | 90 (60) | — | — | — | 15 (10) | — | — | 102 | 20 | 290 | 500 |
| 13 | 45 (25) | 90 (50) | — | — | — | 45 (25) | — | — | 102 | 20 | 290 | 500 |
| 14 | 45 (30) | — | 90 (60) | — | — | 15 (10) | — | — | 102 | −24 | 202 | 500 |
| 15 | 45 (30) | — | — | 90 (60) | — | 15 (10) | — | — | 102 | 18.5 | 189 | 500 |
| 16 | 45 (30) | — | — | — | 90 (60) | 15 (10) | — | — | 102 | −61 | 153 | 500 |
| 17 | 45 (30) | 90 (60) | — | — | — | 15* (10) | — | — | 102 | 20 | 290 | 500 |
| 18 | 45 (30) | 90 (60) | — | — | — | — | 15 (10) | — | 102 | 20 | 290 | 500 |
| 19 | 45 (30) | 90 (60) | — | — | — | — | — | 15 (10) | 102 | 20 | 290 | 500 |
| Comparative Example | | | | | | | | | | | | |
| 11 | 45 (75) | — | — | — | — | 15 (25) | — | — | 102 | — | — | 1000 |
| 12 | 45 (75) | — | — | — | — | 15 (25) | — | — | 102 | — | — | 350 |
| 13 | — | — | — | — | — | 15 (100) | — | — | — | — | — | 50 |
| 14 | — | — | — | — | — | — | — | — | — | — | — | — |
| 15 | 45 (100) | — | — | — | — | — | — | — | 102 | — | — | 500 |
| 16 | — | 90 (100) | — | — | — | — | — | — | — | 20 | 290 | ** |
| 17 | 45 (75) | — | — | — | — | 15 (20) | — | — | 102 | — | — | 650 |
| 18 | 45 (75) | — | — | — | — | 15 (25) | — | — | 102 | — | — | 350 |
| 19 | — | — | — | — | — | 15 (100) | — | — | — | — | — | 50 |
| 20 | 45 (100) | — | — | — | — | — | — | — | 102 | — | — | 500 |

| | Transparent conductive film | | | | |
|---|---|---|---|---|---|
| | Thickness of conductive metal mesh layer (nm) | Surface resistivity of conductive metal mesh layer (Ω/square) | Total light transmittance (%) | Adhesiveness (mN/25 mm) | Evaluation of electronic device | Layer configuration of transparent conductive film |
| Example | | | | | | |
| 12 | 500 | 3.40E+05 | 84 | 80 | ○ | PET + Conductive metal mesh layer + Conductive layer |
| 13 | 500 | 2.80E+05 | 85 | 70 | ○ | PET + Conductive metal mesh layer + Conductive layer |
| 14 | 500 | 3.60E+04 | 84 | 50 | ○ | PET + Conductive metal mesh layer + Conductive layer |
| 15 | 500 | 2.20E+04 | 84 | 47 | ○ | PET + Conductive metal mesh layer + Conductive layer |
| 16 | 500 | 2.60E+04 | 84 | 52 | ○ | PET + Conductive metal mesh layer + Conductive layer |
| 17 | 500 | 1.0 | 81 | — | ○ | PET + Conductive metal mesh layer + Conductive layer |
| 18 | 500 | 5.50E+04 | 83 | 68 | ○ | PET + Conductive metal mesh layer + Conductive layer |
| 19 | 100 | 4.08E+06 | 82 | 65 | ○ | PET + Conductive metal mesh layer + Conductive layer |
| Comparative Example | | | | | | |
| 11 | 500 | 2.70E+09 | 78 | 57 | x | PET + Conductive layer [no component (B)] |
| 12 | 500 | 5.50E+08 | 80 | 30 | x | PET + Conductive layer [no component (B)] |
| 13 | 500 | 4.50E+07 | 86 | — | x | PET + Conductive layer [neither component (A) nor component (B)] |
| 14 | 500 | 2 | 89 | — | — | The conductive layer is the conductive metal mesh layer alone |

TABLE 2-continued

| | | | | | | |
|---|---|---|---|---|---|---|
| 15 | 500 | 3.80E+12 | 88 | — | x | PET + Conductive layer [neither component (B) nor component (C)] |
| 16 | 500 | — | — | — | — | PET + Conductive layer [neither component (A) nor component (C)] |
| 17 | — | 2.70E+10 | 75 | — | x | PET + Conductive layer [no component (B)] |
| 18 | — | 5.50E+11 | 82 | — | x | PET + Conductive layer [no component (B)] |
| 19 | — | 4.50E+09 | 90 | — | x | PET + Conductive layer [neither component (A) nor component (B)] |
| 20 | — | 3.80E+14 | 90 | — | x | PET + Conductive layer [neither component (B) nor component (C)] |

*Polythiophenes: a product name "S305"
** A conductive layer could not be formed due to poor film formation properties.
All of the blending amounts of the components (A), (B) and (C) express parts by mass of each of the active ingredients, and a numerical value in each of the parentheses in the Examples expresses parts by mass or % by mass of each of the components when a total sum of the components (A), (B) and (C) is defined as 100 parts by mass.

From Table 1, the following are confirmed.
(1) In Comparative Examples 1 and 2 using the components (A) and (C) without using the component (B), the surface resistivity is high, and the obtained electronic devices does not reveal commutation properties, so that they does not function as a device.
(2) In Comparative Example 3 containing the component (C) alone, the adhesiveness was poor. In addition, the obtained electronic device did not function as a device due to poor sticking.
(3) In Comparative Example 4 not having a conductive layer, the adhesiveness was not revealed at all, so that an electronic device could not be fabricated.
(4) In Comparative Example 5 containing the component (A) alone, the surface resistivity was high, and the obtained electronic device did not reveal commutation properties, so that it did not function as a device.
(5) In Comparative Example 6 containing the component (B) alone, the film formation properties were poor, so that a conductive layer could not be formed, and the adhesiveness was not revealed at all.
(6) In Comparative Examples 7 to 10 not provided with a conductive metal mesh layer, the surface resistivity was high. In addition, the obtained electronic devices did not reveal commutation properties, so that they did not function as a device.

On the other hand, Examples 1 to 11 were low in terms of surface resistivity, high in terms of transparency, and good in terms of adhesiveness. In addition, the obtained electronic devices revealed commutation properties, so that it was noted that they are also effective as a device.

From Table 2, the following are confirmed.
(1) In Comparative Examples 11 and 12 using the components (A) and (C) without using the component (B), the surface resistivity of the conductive layer was high, and the obtained electronic devices did not reveal commutation properties, so that they did not function as a device.
(2) In Comparative Example 13 containing the component (C) alone, the adhesive force was low, so that the measurement could not be achieved. In addition, the obtained electronic device did not function as a device due to poor sticking.
(3) In Comparative Example 14 not having a conductive layer, the adhesiveness was not revealed at all, so that an electronic device could not be fabricated.
(4) In Comparative Example 15 containing the component (A) alone, the surface resistivity of the conductive layer was high, and the obtained electronic device did not reveal commutation properties, so that it did not function as a device.
(5) In Comparative Example 16 containing the component (B) alone, the film formation properties were poor, so that a conductive layer could not be formed, and the adhesiveness was not revealed at all.
(6) In Comparative Examples 17 to 20 not provided with a conductive metal mesh layer, the surface resistivity was high. In addition, the obtained electronic devices did not reveal commutation properties, so that they did not function as a device.

On the other hand, in Examples 12 to 19 using the components (A), (B) and (C), the surface resistivity of the conductive layer was low, the transparency was high, and the adhesiveness was good. In addition, the obtained electronic devices revealed commutation properties, so that it was noted that they are also effective as a device.

INDUSTRIAL APPLICABILITY

Since the transparent conductive film according to the present invention has excellent adhesiveness and is low in terms of surface resistance and high in terms of transparency, it can be used for electronic devices such as organic devices, e.g., organic transistors, organic memories, organic ELs, etc.; liquid crystal displays; electronic papers; thin-film transistors; electrochromics; electrochemical light-emitting devices; touch panels; displays; solar cells; thermoelectric conversion devices; piezoelectric conversion devices; electric storage devices; etc., and furthermore, it is useful in the field of an electronic device to be manufactured in a roll-to-roll manner by a lamination process.

EXPLANATIONS OF LETTERS OR NUMERALS

1: Conductive layer
2: Conductive metal mesh layer
3: Transparent base material
4: Photoelectric conversion layer
5: Electrode
6: Base material layer
7: Transparent conductive film
8: Electronic device
9: Opening of conductive metal mesh layer

The invention claimed is:
1. A transparent conductive film, consisting of:
a transparent base material;
a conductive metal mesh layer on a surface of the transparent base material; and
an adhesive conductive layer in openings of the conductive metal mesh layer;
wherein:
the conductive metal mesh layer is a fine mesh structure of a metal or alloy in a grid pattern;
the conductive layer consists of a conductive adhesive composition, consisting of a water-soluble vinyl polymer (A), an organic additive (B), and a conductive organic polymer compound (C);

the organic additive (B) is at least one member selected from the group consisting of a water-soluble polyhydric alcohol, a water-soluble pyrrolidone, and a hydrophilic aprotic solvent;

the conductive organic polymer compound (C) is at least one member selected from the group consisting of a polyaniline, a polvpyrrole, a polythiophene, and a derivative thereof;

the conductive adhesive composition comprises 10 to 40 parts by mass of component (A), 20 to 65 parts by mass of component (B), and 5 to 55 parts by mass of component (C), based on a total of 100 parts by mass of components (A), (B), and (C); and the water-soluble vinyl polymer (A) is an acrylic acid polymer.

2. The film according to claim 1, wherein, when a glass transition temperature of the water-soluble vinyl polymer (A) is T1, a melting point of the organic additive (B) is T2, and a boiling point of the organic additive (B) at 0.101 MPa (760 mmHg) is T3, T2<T1<T3.

3. An electronic device comprising the transparent conductive film according to claim 1.

4. The electronic device according to claim 3, comprising the transparent conductive film, a photoelectric conversion layer, and a cathodic layer arranged in this order.

5. The film according to claim 1, wherein the conductive mesh layer has a thickness of from 20 nm to 100 μm.

6. The film according to claim 1, wherein a glass transition temperature of the water-soluble vinyl polymer (A) is from −50 to 150° C.

7. The film according to claim 1, wherein a glass transition temperature of the water-soluble vinyl polymer (A) is from 20 to 140° C.

8. The film according to claim 1, wherein a glass transition temperature of the water-soluble vinyl polymer (A) is from 30 to 130° C.

9. The film according to claim 1, wherein the organic additive (B) has a boiling point of from 120 to 300° C.

10. The film according to claim 1, wherein the organic additive (B) has a boiling point of from 140 to 300° C.

11. The film according to claim 1, wherein the conductive layer has a thickness of from 5 to 10,000 nm.

12. The film according to claim 1, wherein the conductive layer has a thickness of from 30 to 3,000 nm.

13. The film according to claim 1, wherein the water-soluble vinyl polymer (A) has a structural unit —$CH_2$—CH(COOH)— and contains at least 30 mole % of the structural unit.

14. The film according to claim 1, wherein a total light transmittance of the conductive layer is 80% or more.

15. The film according to claim 1, wherein a weight average molecular weight (Mw) of the water-soluble polyvinyl polymer (A) is from 500 to 300,000.

16. The film according to claim 1, wherein a weight average molecular weight (Mw) of the water-soluble polyvinyl polymer (A) is from 1,000 to 200,000.

17. The film according to claim 1, wherein a weight average molecular weight (Mw) of the water-soluble polyvinyl polymer (A) is from 3,000 to 150,000.

18. A method for manufacturing an electronic device comprising a transparent conductive film, the method comprising:

forming a photoelectric conversion layer on a cathodic layer; and sticking an adhesive conductive layer of the transparent conductive film and a surface of the photoelectric conversion layer to each other at a temperature at which a constituent conductive adhesive composition of the adhesive conductive layer is softened or higher;

wherein:

the transparent conductive film, consists of:
 a transparent base material;
 a conductive metal mesh layer on a surface of the transparent base material; and
 the adhesive conductive layer in openings of the conductive metal mesh layer;

wherein:

the conductive metal mesh layer is a fine mesh structure of a metal or alloy in a grid pattern;

the conductive layer consists of the conductive adhesive composition, consisting of a water-soluble vinyl polymer (A), an organic additive (B), and a conductive organic polymer compound (C);

the organic additive (B) is at least one member selected from the group consisting of a water-soluble polyhydric alcohol, a water-soluble pyrrolidone, and a hydrophilic aprotic solvent;

the conductive organic polymer compound (C) is at least one member selected from the group consisting of a polyaniline, a polypyrrole, a polythiophene, and a derivative thereof;

the conductive adhesive composition comprises 10 to 40 parts by mass of component (A), 20 to 65 parts by mass of component (B), and 5 to 55 parts by mass of component (C), based on a total of 100 parts by mass of components (A), (B), and (C); and the water-soluble vinyl polymer (A) is an acrylic acid polymer.

* * * * *